United States Patent
Petrov et al.

(10) Patent No.: US 10,939,541 B2
(45) Date of Patent: Mar. 2, 2021

(54) SHIELD STRUCTURE FOR A LOW CROSSTALK SINGLE ENDED CLOCK DISTRIBUTION CIRCUIT

(71) Applicants: Dmitry Petrov, Ottawa (CA); Zhonggui Xiang, Ottawa (CA)

(72) Inventors: Dmitry Petrov, Ottawa (CA); Zhonggui Xiang, Ottawa (CA)

(73) Assignee: Huawei Technologies Co., LTD., Shenzhen (CN)

( * ) Notice: Subject to any disclaimer, the term of this patent is extended or adjusted under 35 U.S.C. 154(b) by 427 days.

(21) Appl. No.: 15/476,463

(22) Filed: Mar. 31, 2017

(65) Prior Publication Data
US 2018/0287618 A1    Oct. 4, 2018

(51) Int. Cl.
*H03L 7/00* (2006.01)
*H05K 1/02* (2006.01)

(52) U.S. Cl.
CPC ......... *H05K 1/0221* (2013.01); *H05K 1/0219* (2013.01); *H05K 1/0225* (2013.01); *H05K 1/0216* (2013.01); *H05K 1/0218* (2013.01); *H05K 1/0224* (2013.01); *H05K 1/0227* (2013.01)

(58) Field of Classification Search
CPC combination set(s) only.
See application file for complete search history.

(56) References Cited

U.S. PATENT DOCUMENTS

| 4,513,266 | A | * | 4/1985 | Ishihara | H01P 3/085 174/360 |
|---|---|---|---|---|---|
| 5,309,015 | A | | 5/1994 | Kuwata et al. | |
| 5,381,157 | A | * | 1/1995 | Shiga | H01Q 1/247 333/246 |
| 5,406,235 | A | * | 4/1995 | Hayashi | H01P 1/203 333/202 |
| 5,479,138 | A | * | 12/1995 | Kuroda | H01P 3/088 333/1 |
| 6,081,022 | A | | 6/2000 | Mitra et al. | |
| 6,731,513 | B2 | * | 5/2004 | Rodgers | B81B 7/0006 174/384 |

(Continued)

FOREIGN PATENT DOCUMENTS

| CN | 101290639 A | 10/2008 |
|---|---|---|
| CN | 102856298 A | 1/2013 |

(Continued)

*Primary Examiner* — Steven T Sawyer
*Assistant Examiner* — Paresh H Paghadal

(57) ABSTRACT

An integrated circuit is described. The integrated circuit includes a first layer, a first clock line for carrying a first clock signal, and a second clock line for carrying a second clock signal. The second clock line runs alongside the first clock line for a distance. The integrated circuit includes a shield structure for shielding the clock line from crosstalk and/or other interference. The shield structure includes a shield wall extending from the first layer. The shield wall runs between the first and second clock lines for at least a portion of the distance. The shield structure may also include a shield cage extending from the first layer and surrounding the first and second clock lines for at least a portion of the distance. The shield cage has a plurality of openings. The shield cage and/or shield wall may be connected to the ground of an AC power supply.

17 Claims, 13 Drawing Sheets

(56) References Cited

U.S. PATENT DOCUMENTS

| | | | |
|---|---|---|---|
| 6,747,340 B2* | 6/2004 | Barnes | H01L 23/5225 257/659 |
| 6,777,620 B1* | 8/2004 | Abe | H01L 23/552 174/255 |
| 7,030,455 B2* | 4/2006 | Gamand | H01L 23/5225 257/508 |
| 7,049,901 B2* | 5/2006 | Sacco | H01P 3/121 333/4 |
| 7,417,301 B2* | 8/2008 | Taghizadeh-Kaschani | H01L 23/5227 257/211 |
| 7,759,774 B2* | 7/2010 | Fraser | H01L 23/5225 174/262 |
| 7,812,694 B2* | 10/2010 | Ding | H01P 3/003 333/161 |
| 7,999,361 B1* | 8/2011 | Chen | H01L 23/5225 257/659 |
| 8,130,059 B2* | 3/2012 | Wang | H01P 9/00 333/156 |
| 8,134,514 B2* | 3/2012 | Yamaguchi | H01Q 13/12 343/770 |
| 8,279,025 B2* | 10/2012 | Cho | H01P 3/06 257/664 |
| 8,324,979 B2* | 12/2012 | Cho | H01L 23/5225 333/238 |
| 8,629,741 B2* | 1/2014 | Cho | H01P 1/2013 333/1 |
| 8,789,003 B1* | 7/2014 | Ding | G06F 17/5063 716/133 |
| 8,823,135 B2* | 9/2014 | Chen | H01L 23/5225 257/531 |
| 8,922,291 B2* | 12/2014 | Xie | H01P 3/02 333/238 |
| 8,922,293 B2* | 12/2014 | Cho | H01P 3/081 333/238 |
| 8,988,166 B2* | 3/2015 | Elad | H01P 3/003 333/161 |
| 9,425,603 B2* | 8/2016 | Jur | H05K 5/0247 |
| 2001/0040274 A1* | 11/2001 | Hidaka | H01L 23/552 257/659 |
| 2002/0074605 A1 | 6/2002 | Gamand et al. | |
| 2002/0075104 A1* | 6/2002 | Kwon | H01L 23/5225 333/238 |
| 2005/0087856 A1 | 4/2005 | Joiner et al. | |
| 2006/0192288 A1* | 8/2006 | Ueno | H01L 23/5225 257/758 |
| 2006/0255434 A1 | 11/2006 | Degani et al. | |
| 2007/0241844 A1* | 10/2007 | Kim | H01P 3/003 333/238 |
| 2008/0173476 A1* | 7/2008 | Cotton | H05K 1/0218 174/384 |
| 2008/0276213 A1 | 11/2008 | Aoki et al. | |
| 2009/0079488 A1 | 3/2009 | Motoyoshi et al. | |
| 2009/0249610 A1* | 10/2009 | Ding | H01P 3/003 29/600 |
| 2009/0251232 A1* | 10/2009 | Ding | H01P 3/003 333/1 |
| 2009/0315641 A1* | 12/2009 | Ding | H01P 1/184 333/161 |
| 2010/0126767 A1* | 5/2010 | Kotsubo | C23C 18/1608 174/389 |
| 2010/0141354 A1* | 6/2010 | Cho | H01P 3/06 333/160 |
| 2010/0149672 A1* | 6/2010 | Lee | H01J 11/44 359/885 |
| 2010/0214041 A1* | 8/2010 | Cho | H01L 23/5225 333/238 |
| 2010/0225425 A1* | 9/2010 | Cho | H01P 1/2013 333/238 |
| 2011/0115580 A1* | 5/2011 | Fontaine | H01P 3/06 333/243 |
| 2012/0286393 A1* | 11/2012 | Lin | H01L 23/5223 257/532 |
| 2013/0002375 A1* | 1/2013 | Yang | H01L 23/5225 333/238 |
| 2013/0112472 A1* | 5/2013 | Welland | H03L 7/18 174/350 |
| 2013/0249105 A1* | 9/2013 | Lin | H01L 23/3157 257/774 |
| 2016/0174419 A1* | 6/2016 | Chowdhury | H05K 1/0306 174/258 |
| 2018/0180828 A1* | 6/2018 | Zhao | G02B 6/4277 |
| 2018/0226708 A1* | 8/2018 | Li | H01P 3/06 |
| 2019/0086458 A1* | 3/2019 | Seo | G01N 21/3581 |
| 2019/0181099 A1* | 6/2019 | Then | H01L 23/5225 |

FOREIGN PATENT DOCUMENTS

| | | |
|---|---|---|
| EP | 1187206 A1 | 3/2002 |
| EP | 1688996 A | 8/2006 |

\* cited by examiner

SHIELD STRUCTURE FOR A LOW CROSSTALK SINGLE ENDED CLOCK DISTRIBUTION CIRCUIT

FIELD

The present disclosure relates to a shield structure used for a clock distribution circuit on a chip. In particular, the present disclosure relates to a shield structure used for a clock distribution circuit of single-ended clocks on a chip.

BACKGROUND

Performance of serial interfaces relies on clocking quality, quantified by "clock jitter". As the speed of the interface increases, tolerance for clocking jitter decreases. For example, high frequency (e.g., 10-15 GHz) analog-to-digital conversion (ADC) circuits or serializer/deserializer circuits typically require sampling clocks to have jitter of less than a hundred femto seconds.

In many cases, multiple clock lines carrying clock signals of different frequencies are routed alongside each other, and typically run alongside each other for a long distance (e.g., several millimeters). Crosstalk can occur between these clock lines, giving rise to mixing products that combine the frequencies of the different clock signals. Mixing products, once introduced, may be propagated and multiplied along the clock distribution circuit, for example due to active circuitry. This crosstalk thus introduces undesirable jitter in the clock signals and limits the critical clock distribution specification, which is the maximum span of quality clock routing within a chip.

Although differential clock signals have been attempted to mitigate such crosstalk, use of differential clock signals requires increased power consumption and occupies greater area on a chip.

SUMMARY

Example clock distribution circuits described herein may enable reduction of crosstalk and associated clocking jitter for single-ended clock signals. This may enable increase in the clock distribution span within specified jitter limits. Further, the reduction of crosstalk may make the use of single-ended clock signals, instead of differential clock signals, feasible within tight jitter requirements; even spanning clock distribution distances of over 3 mm. Using a single-ended clock line instead of differential clock lines may enable power savings and space savings. The reduction of crosstalk may be achieved using a shield structure, for example shield wall and/or shield cage, described below.

In examples described herein, a single-ended clock distribution circuit is described. A shield wall running between two single-ended clock lines for at least a portion of the length of the clock lines may help to mitigate crosstalk between the clock lines. A shield cage may surround the clock lines for at least a portion along the length of the clock lines to further mitigate crosstalk.

In some aspects, the present disclosure describes an integrated circuit. The integrated circuit includes a first layer, a first clock line for carrying a first clock signal and a second clock line for carrying a second clock signal. The second clock line runs alongside the first clock line for a distance. The integrated circuit also includes a shield structure. In one embodiment, the shield structure includes a shield wall extending from the first layer, and running between the first and second clock lines for at least a portion of the distance. In a further embodiment that can be combined with other embodiments disclosed herein, the shield structure also includes a shield cage extending from the first layer and surrounding the first and second clock lines for at least a same or different portion of the distance. In a further embodiment that can be combined with other embodiments disclosed herein, the shield cage has defined therein a plurality of openings.

Either clock line may be driven by an active buffer, and loaded by an active buffer. In any of the embodiments disclosed herein, identical CMOS inverter structures accompanied by active duty-cycle distortion (DCD) correctors may be used as active buffers and loads.

In some example aspects, the present disclosure describes an integrated circuit. The integrated circuit includes a first layer. The integrated circuit also includes a clock line for carrying a clock signal over a distance. The integrated circuit also includes a shield cage extending from the first layer and surrounding the clock line for at least a portion of the distance, the shield cage having defined therein a plurality of openings.

In any of the previous aspects/embodiments, the shield cage may include two side walls extending from the first layer. Each side wall may be positioned alongside a respective one of the first and second clock lines. The shield cage may also include an upper wall extending between the side walls and over both the first and second clock lines. The plurality of openings may be defined in at least the upper wall.

In any of the previous aspects/embodiments, the plurality of openings may be further defined in the side walls.

In any of the previous aspects/embodiments, each opening defined in the side walls may have dimensions of about 2.35 µm×3.39 µm.

In any of the previous aspects/embodiments, each opening defined in the upper wall may have dimensions of about 9.54 µm×10 µm.

In any of the previous aspects/embodiments, each opening defined in the upper wall may have dimensions of about 9.54 µm×42 µm.

In any of the previous aspects/embodiments, the shield wall may have at least one opening defined therein. The at least one opening may be sized to accommodate passing of one or more other signals that may be routed across the clock lines.

In any of the previous aspects/embodiments, for a first portion of the distance, the shield structure may include only one of: the shield wall or the shield cage. For a second portion of the distance, the shield structure may include both the shield wall and the shield cage.

In any of the previous aspects/embodiments, for a first portion of the distance, the shield structure may include only the shield wall. For a second portion of the distance, the shield structure may include only the shield cage. For a third portion of the distance, the shield structure may include both the shield wall and the shield cage.

In any of the previous aspects/embodiments, the shield wall may extend from the first layer to a topmost metal layer of the integrated circuit.

In any of the previous aspects/embodiments, the shield cage may extend across the topmost metal layer, over the first and second clock lines.

In any of the previous aspects/embodiments, the first layer may have defined therein another plurality of openings.

In any of the previous aspects/embodiments, each clock signal may be carried by a respective pair of differential clock lines. In some embodiments that can be combined with other embodiments disclosed herein, the first clock signal may be carried by a first pair of clock lines, the second clock signal may be carried by a second pair of clock lines running alongside the first pair, and the shield wall may run between the first and second pairs of clock lines. In some embodiments that can be combined with other embodiments disclosed herein, there may be more than two clock signals, which can be carried respectively by more than two pairs of differential clock lines, with shield walls between adjacent pairs of clock lines and/or a shield cage over the clock lines.

In any of the previous aspects/embodiments, there may be more than two single-ended clock lines running alongside each other, with shield walls between adjacent clock lines and/or a shield cage over the clock lines. In some embodiments that can be combined with other embodiments disclosed herein, the integrated circuit may include a third clock line carrying a third clock signal and a fourth clock line carrying a fourth clock signal. The third and fourth clock lines may run alongside the first and second clock lines for at least the distance. The shield structure may include a plurality of shield walls, each shield wall running between respective adjacent pairs of clock lines for at least a respective portion of the distance. The shield cages may surround the first, second, third and fourth clock lines for at least the same or different portion of the distance.

In some aspects, the present disclosure provides an integrated circuit. The integrated circuit includes a first layer, a first clock line for carrying a first clock signal, and a second clock line for carrying a second clock signal. The second clock line runs alongside the first clock line for a distance. The integrated circuit also includes a shield wall extending from the first layer. The shield wall runs between the first and second clock lines for at least a portion of the distance.

In any of the previous aspects/embodiments, the shield wall may have at least one opening defined therein. The at least one opening may be sized to accommodate passing of one or more other signals that may be routed across the clock lines.

In any of the previous aspects/embodiments, the shield wall may extend from the first layer to a topmost metal layer of the integrated circuit.

In any of the previous aspects/embodiments, the first clock signal may be carried by a first pair of clock lines, the second clock signal may be carried by a second pair of clock lines running alongside the first pair, and the shield wall may run between the first and second pairs of clock lines.

In any of the previous aspects/embodiments, the integrated circuit may include a third clock line carrying a third clock signal and a fourth clock line carrying a fourth clock signal. The third and fourth clock lines may run alongside the first and second clock lines for at least the distance. There may be a plurality of shield walls, each shield wall running between respective adjacent pairs of clock lines for at least a respective portion of the distance.

In some aspects, the present disclosure describes a method for fabricating a clock distribution circuit. The method includes extending a portion of a shield wall from a first layer. The method also includes providing first and second clock lines on either side of the portion of the shield wall. The first and second clock lines run alongside each other for a distance. The method also includes extending the portion of the shield wall to higher layers of the circuit, to form the shield wall.

In any of the previous aspects/embodiments, the method may also include forming a shield cage in a higher layer of the circuit, over the first and second clock lines.

In any of the previous aspects/embodiments, the shield cage may be formed with a plurality of openings in the higher layer of the circuit.

In any of the previous aspects/embodiments, providing the first and second clock lines may include providing first and second pairs of clock lines on either side of the portion of the shield wall, the first and second pairs of clock lines running alongside each other for the distance.

In any of the previous aspects/embodiments, the first layer may be connected to a power supply.

In any of the previous aspects/embodiments, the first layer may be connected to a ground of a power supply.

In any of the previous aspects/embodiments, the first layer may be an AC ground layer.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
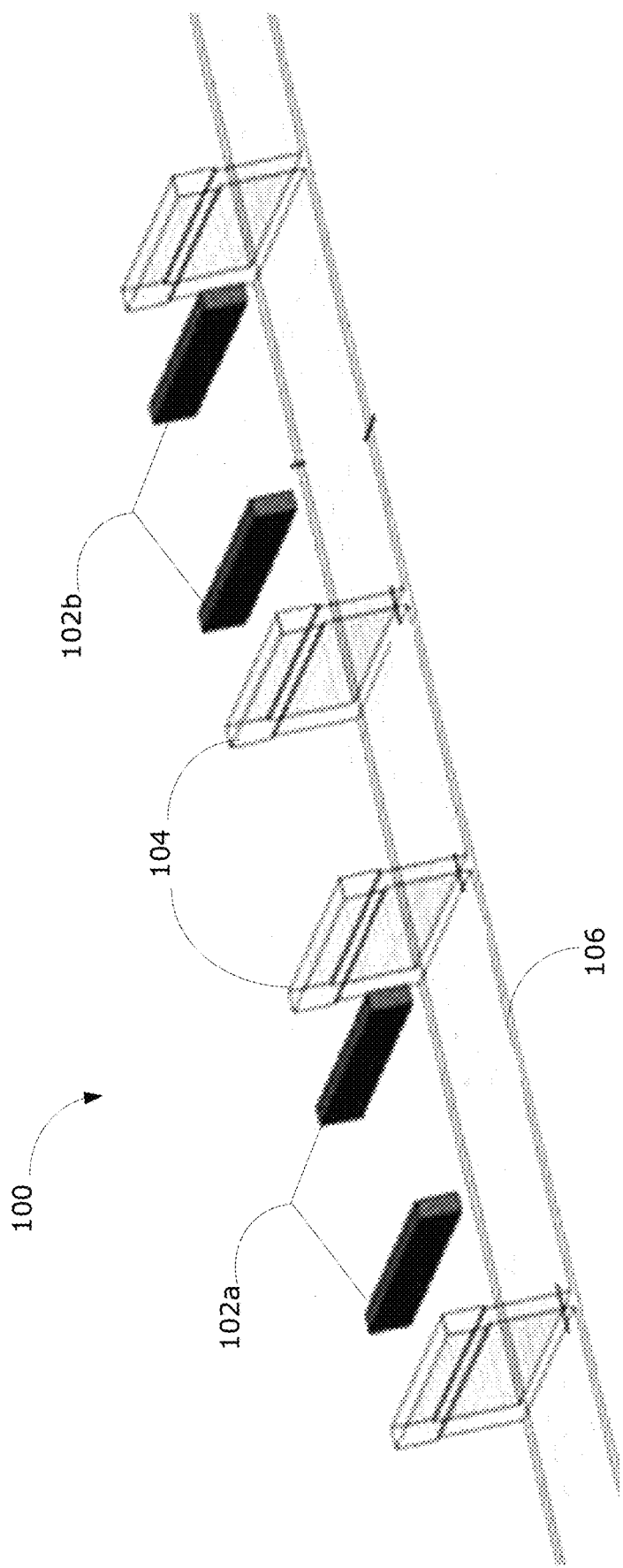
FIG. 1 is a perspective view of an example prior art circuit for distribution of differential clock signals.

FIG. 1 shows an example conventional differential clock distribution circuit 100. A differential clock signal is carried by a pair of clock lines. In this example, one pair of clock lines 102a carries a clock signal at a first frequency $f_0$ and a second pair of clock lines 102b carries another clock signal at a different second frequency $f_1$. The clock lines 102a, 102b are generally referred to as clock lines 102. The two pairs of clock lines 102 run alongside each other for a non-trivial distance. An alternating current (AC) ground isolation 104 extends from the first layer 106 and surrounds each pair of clock lines 102 from three sides. In the present disclosure, a "first layer" may generally be any layer on which the clock distribution circuit is provided. The first layer may be connected to a power supply, for example the ground of a power supply. In some examples, the first layer may be a ground layer, for example an AC ground layer. An AC ground may serve to provide a near zero resistance path to ground, at the lowest frequency of interest. Thus, the first layer need not be connected to a direct current (DC) ground. The isolation 104 may be connected to ground or to a low impedance supply, for example via the first layer 106. A differential signal approach may allow for the two pairs of clock lines 102, carrying different frequency clock signals, to run alongside each other with limited crosstalk. However, this approach requires twice as much space as a single-ended approach. Further, more active drivers are required to drive the clock lines 102, two for each pair 102a, 102b, resulting in greater power consumption.

Using single-ended clock distribution circuit may enable a decrease (e.g., about 20% decrease) in the area occupied by the clock distribution circuit, and a decrease (e.g., about 50% decrease) in power consumption, compared to a differential clock distribution circuit.

Figure 2:
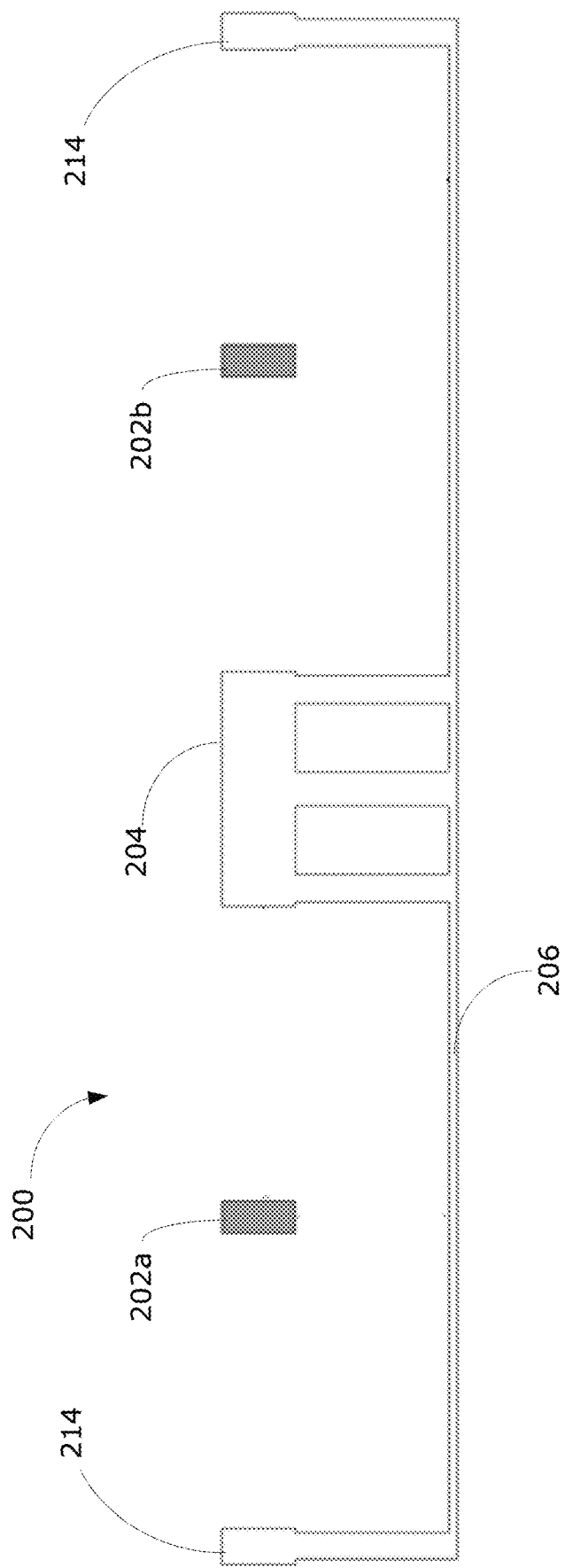
FIG. 2 shows a cross-sectional view of an example circuit for distribution of single-ended clock signals.

An example of a single-ended clock distribution circuit 200 is shown in the cross-sectional view of FIG. 2. In this example circuit 200, two clock lines 202a, 202b (generally, clock line 202) each carries a respective clock signal at respective different frequencies. The clock lines 202 may be provided in the M11 layer of the integrated circuit, or other metal layers (e.g., M10). The two clock lines 202 run alongside each other for a non-trivial distance on the integrated circuit. A spacer 204 extend from the first layer 206 (e.g., the M9 layer of an integrated circuit) and runs between the clock lines 202. The spacer 204 may provide some isolation between the clock lines 202. Side isolation 214 are provided on either side of the clock lines 202.

Figure 3:
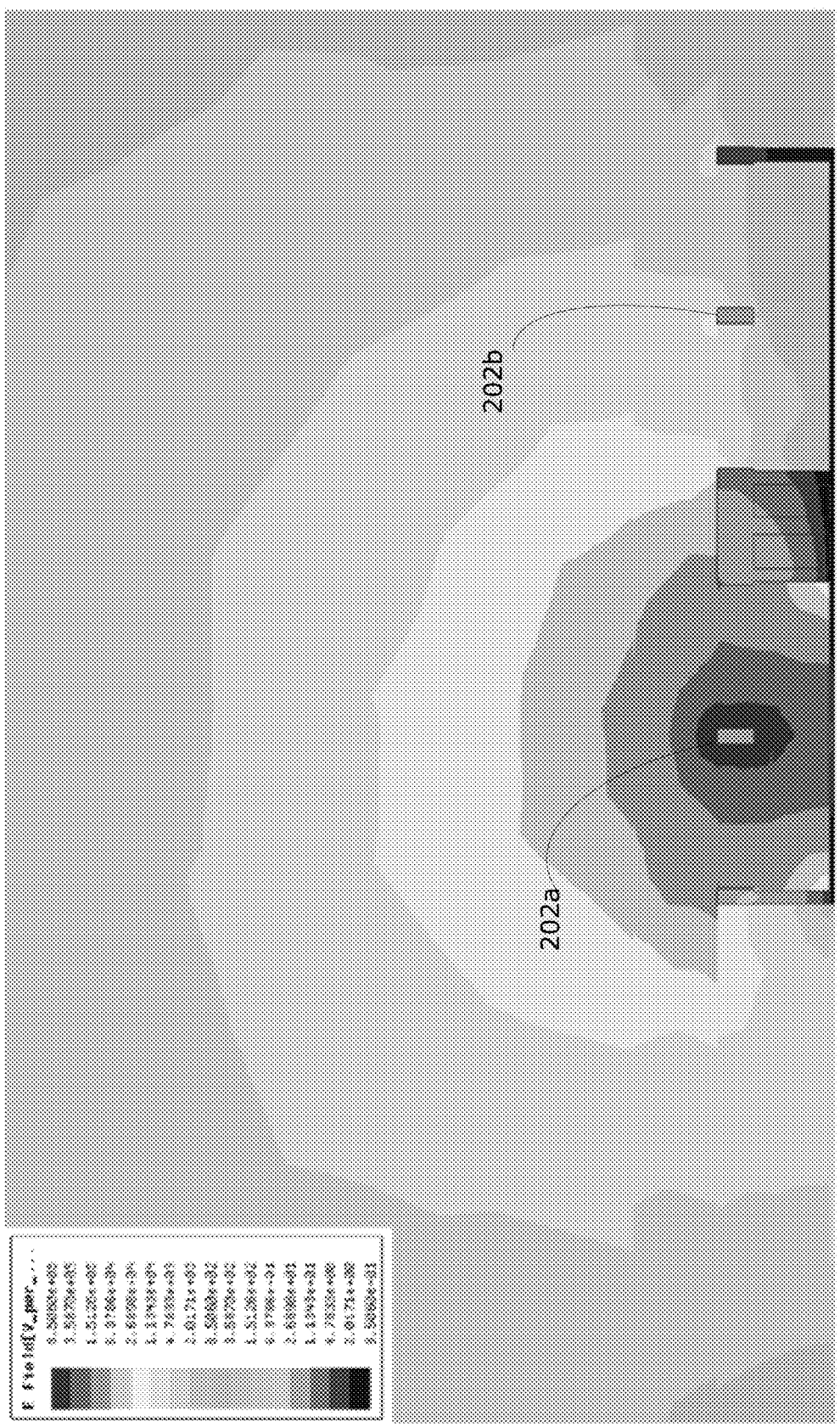
FIG. 3 is a plot showing a simulated electric field produced by one of the clock lines in FIG. 2.

However, as seen in the simulated electric field plotted in FIG. 3, isolation between the clock lines 202 is poor. In the simulation shown, each clock line 202 has a width of 0.5 µm, and is positioned at a height of 2.35 µm from the first layer 206 and at a lateral distance of 4.52 µm from the spacer 204; the spacer has a width of 3.6 µm.

Figure 4:
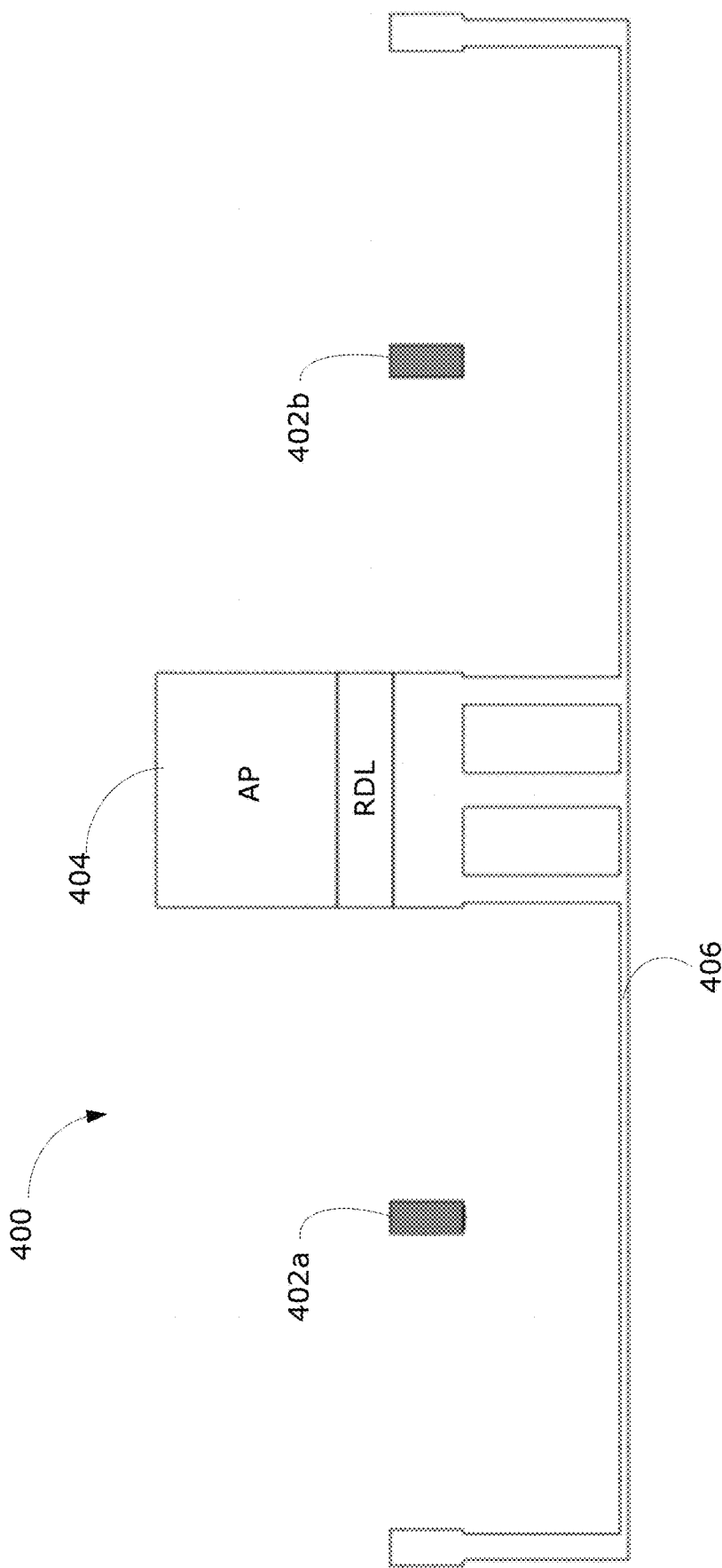
FIG. 4 shows a cross-sectional view of an example circuit for distribution of single-ended clock signals, including a shield wall.

FIG. 4 is a cross-sectional view of another single-ended clock distribution circuit 400, similar to that of FIG. 2, but with the addition of a shield structure, in this case a shield wall 404 extending from the first layer 406. Two single-ended clock lines 402a, 402b (generally, clock line 402) run alongside each other for a distance. The shield wall 404 runs between the two clock lines 402, for at least a portion of the distance. Each clock line 402 carries a respective clock signal at respective different frequencies. In this example, the shield wall 404 may extend from the first layer 406 (e.g., M9 layer of the integrated circuit) up to the redistribution via layer (RDL) and may further extend up to the topmost metal layer, for example extending up to the aluminum for bond pad (AP) layer of the integrated circuit. In this example, the shield wall 404 has a height of about 7.075 µm (measured from the first layer 406). Generally, the height of the shield wall 404 depends on the layers to which the shield wall 404 is extended. For example, extending the shield wall 404 to the AP layer may provide a high enough shield wall 404 for better isolation between the clock lines 402.

Figure 5:
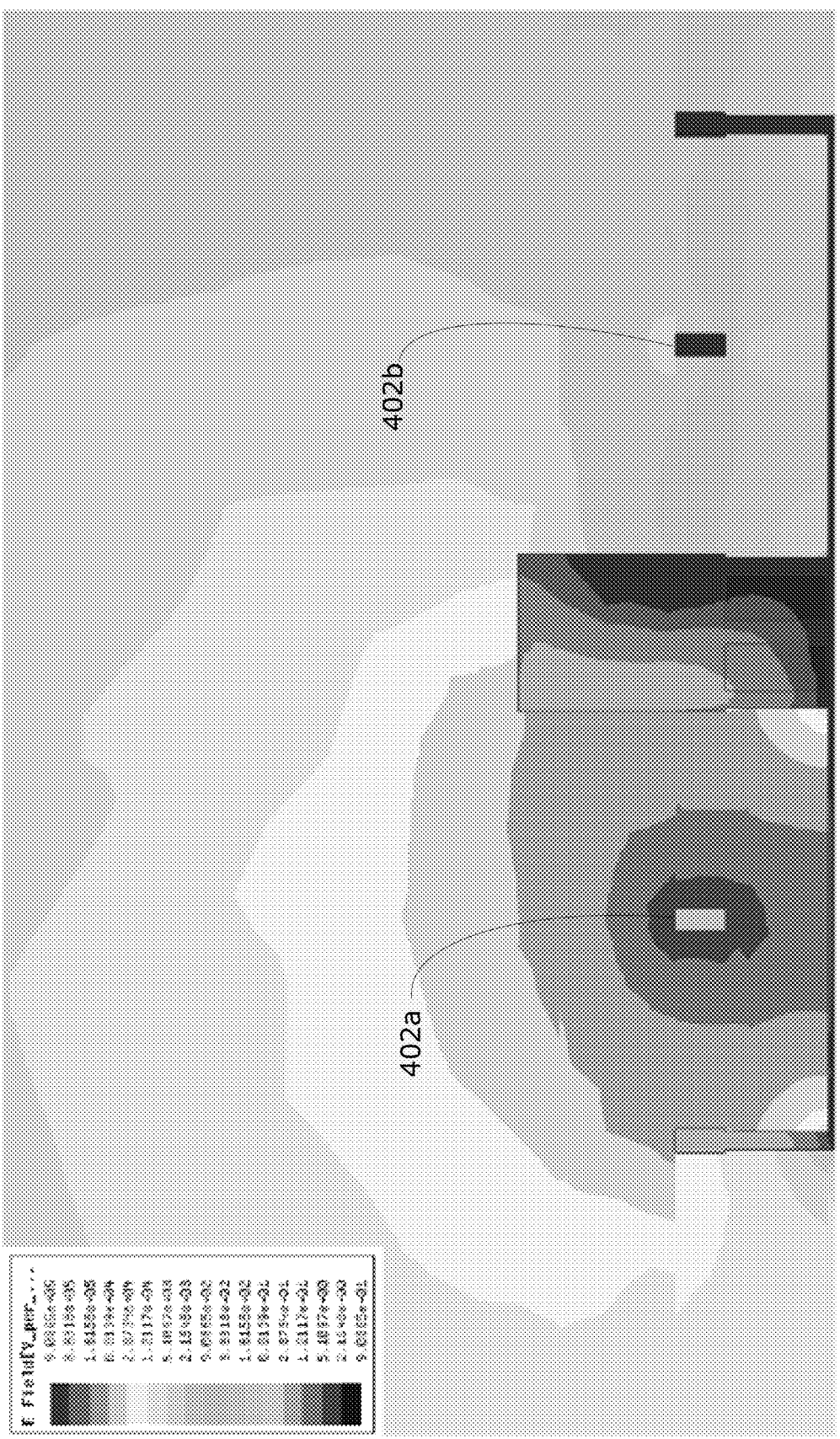
FIG. 5 is a plot showing a simulated electric field produced by one of the clock lines in FIG. 4.

The simulated electric field emitted by one clock line 402a is plotted in FIG. 5. The dimensions for this simulation are the same as those in the simulation shown in FIG. 3, but with the addition of the shield wall 404. As can be seen in FIG. 5, isolation between the clock lines 402 is improved compared to the situation seen in FIG. 3, due to the addition of the shield wall 404. From simulations, it was found that the arrangement shown in FIG. 4 was able to achieve isolation of −66 dB at 15 GHz between the clock lines 402, similar to the case where differential clock lines are used (e.g., as shown in FIG. 1).

It should be noted that in some cases it may be necessary to provide openings in the shield wall 404 to allow routing of other signals and/or power lines across the clock lines 402. The openings in the shield wall 404 may have different sizes to accommodate the passing of other signals that may be routed across the clock lines. Opening in the shield wall 404 may reduce the isolation between the clock lines 402. This may still satisfy jitter requirements, for example for lower frequency (e.g., below 1 GHz) clock signals where jitter requirements are not as tight. Jitter requirements may also be satisfied even for higher frequency (e.g., 10-15 GHz) clock signals if there are few such openings in the shield wall 404 and/or if the clock distribution span is relatively short.

Figure 6A:
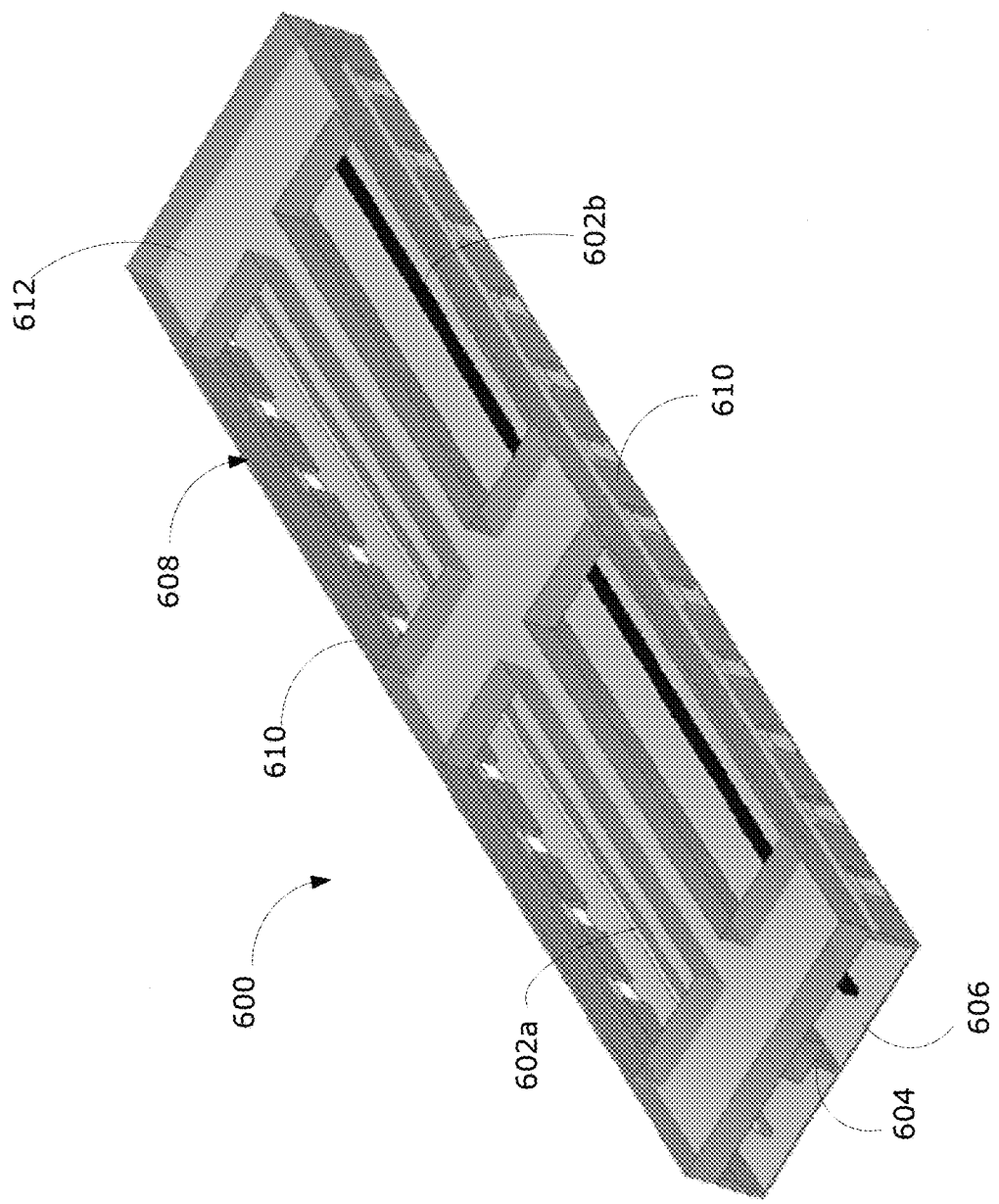
FIGS. 6A and 6B show an example circuit for distribution of singled-ended clock signals, including an example shield cage.
Figure 6B:
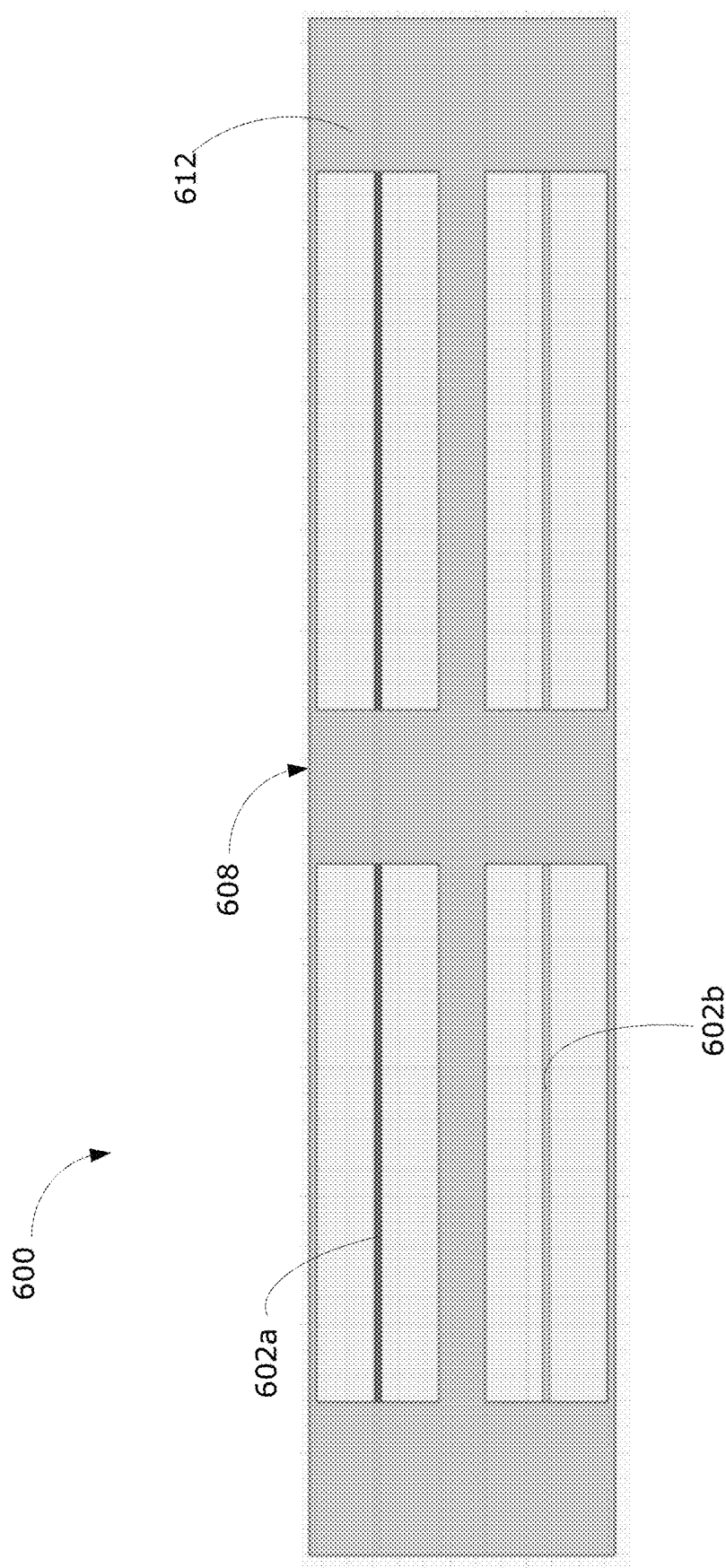

FIG. 6A is a perspective view of another example clock distribution circuit 600. FIG. 6B is a top view of the circuit 600. This circuit 600 is similar to the circuit 400 of FIG. 4, but the shield structure includes a shield cage 608 in addition to a shield wall 604 (similar to the shield wall 404 described above with respect to FIG. 4). The two single-ended clock lines 602a, 602b (generally, clock line 602) run alongside each other for a distance. The shield cage 608 extends from the first layer 606 and surrounds both clock lines 602 for at least a portion of the distance. It should be noted that the shield cage 608 surrounds but does not completely enclose the clock lines 602. That is, there are one or more openings in the shield cage 608.

For example, the shield cage 608 includes openings in side walls 610 and openings in an upper wall 612 extending between the side walls 610. The side walls 610 may extend from the first layer 606 up to the AP layer (similar to the shield wall 604). In this example, openings in the upper wall 612 may be about 9.54 µm (width, +/−20%)×42 µm (length, +/−20%). In the present disclosure, length is measured along the longitudinal axis (i.e., the axis of the clock lines 602), width is measured laterally (i.e., in the direction between clock lines 602, and height is measured in the remaining Cartesian direction. The upper wall 612 may extend between the side walls 610 and along the AP layer. The openings in the side walls 610 may be provided to allow routing of other lines across the clock lines 602. For example, openings in the side walls 610 may be about 2.35 µm (height)×3.39 µm (length, +/−10%). Where both side walls 610 have openings, the openings may be staggered between the side walls 610 (so that there is no direct line-of-sight through both side walls 610), for better isolation. There may be no openings in the side walls 610 in some examples. Though side walls 610 and an upper wall 612 are shown to form the shield cage 608, other geometries may be used for the shield cage 608. For example, the shield cage 608 may be formed as a single wall curving over both clock lines 602.

Although greater isolation between the clock lines 602 may be achieved with a solid shield cage 608 (i.e., without any openings), this may result in the shield cage 608 having an unacceptably high capacitance. Thus, design of the shield cage 608 may involve a trade-off between isolation and capacitance. Appropriate simulations may be carried out to determine suitable dimensions and configurations of the shield cage 608 to meet isolation and/or capacitance requirements.

Figure 11:
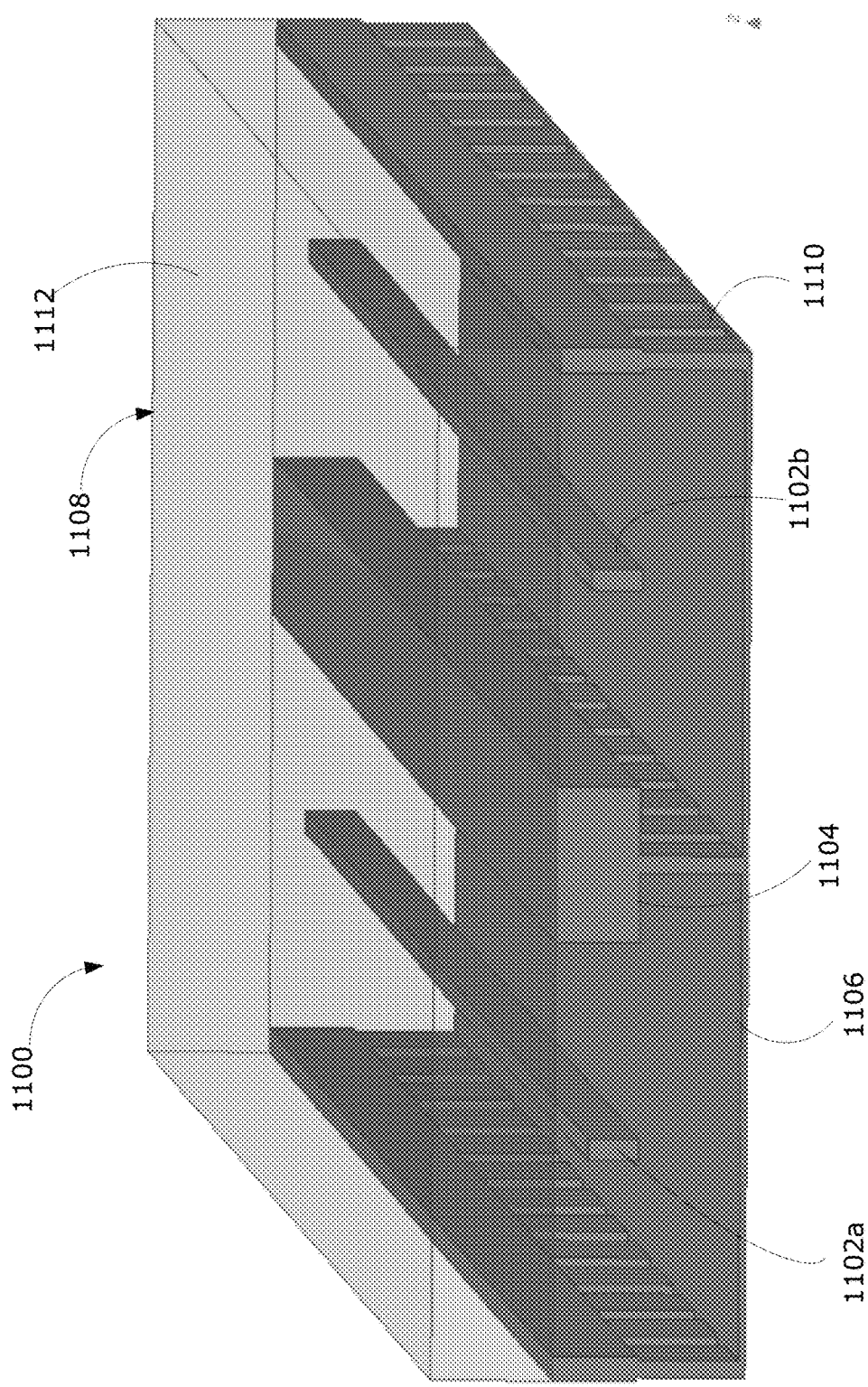
FIG. 11 shows an example circuit having a shield cage without openings.

An example of a shield cage having no top openings is shown in the example circuit 1100 of FIG. 11. This circuit 1100 is similar to the circuit 600 of FIGS. 6A and 6B. A shield cage 1108 and shield wall 1104 is provided about clock lines 1102a, 1102b (generally, clock line 1102). The upper wall 1112 of the shield cage 1108 is shown semi-transparent, to allow better visualization of the circuit 1100.

The shield cage 1108 has no openings in the upper wall 1112, however openings are still present in the side walls 1110. The shield cage 1108 extends from the first layer 1106 and surrounds both clock lines 1102 for at least a portion of the distance.

Figure 7A:
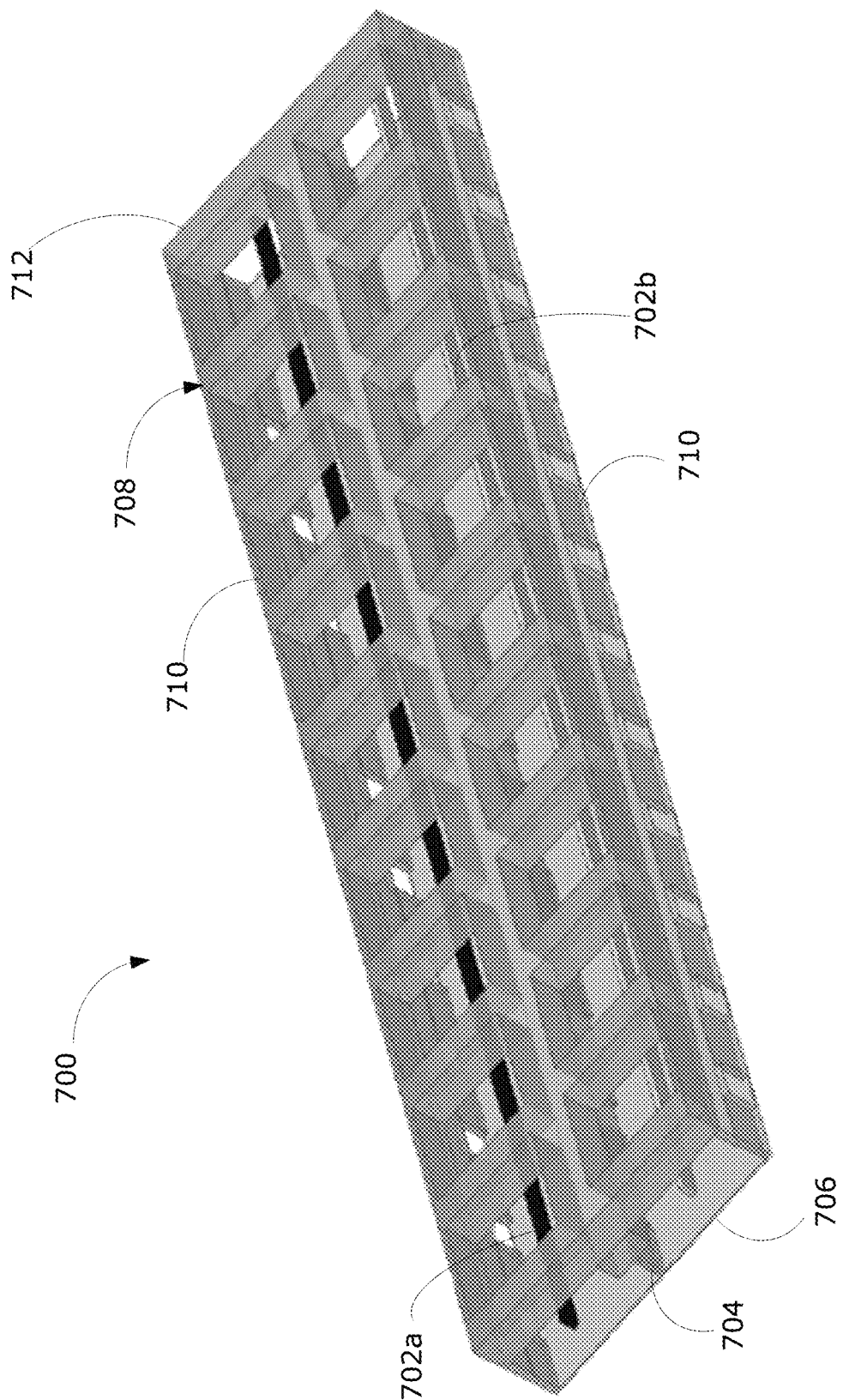
FIGS. 7A and 7B show an example circuit for distribution of singled-ended clock signals, including another example shield cage.
Figure 7B:
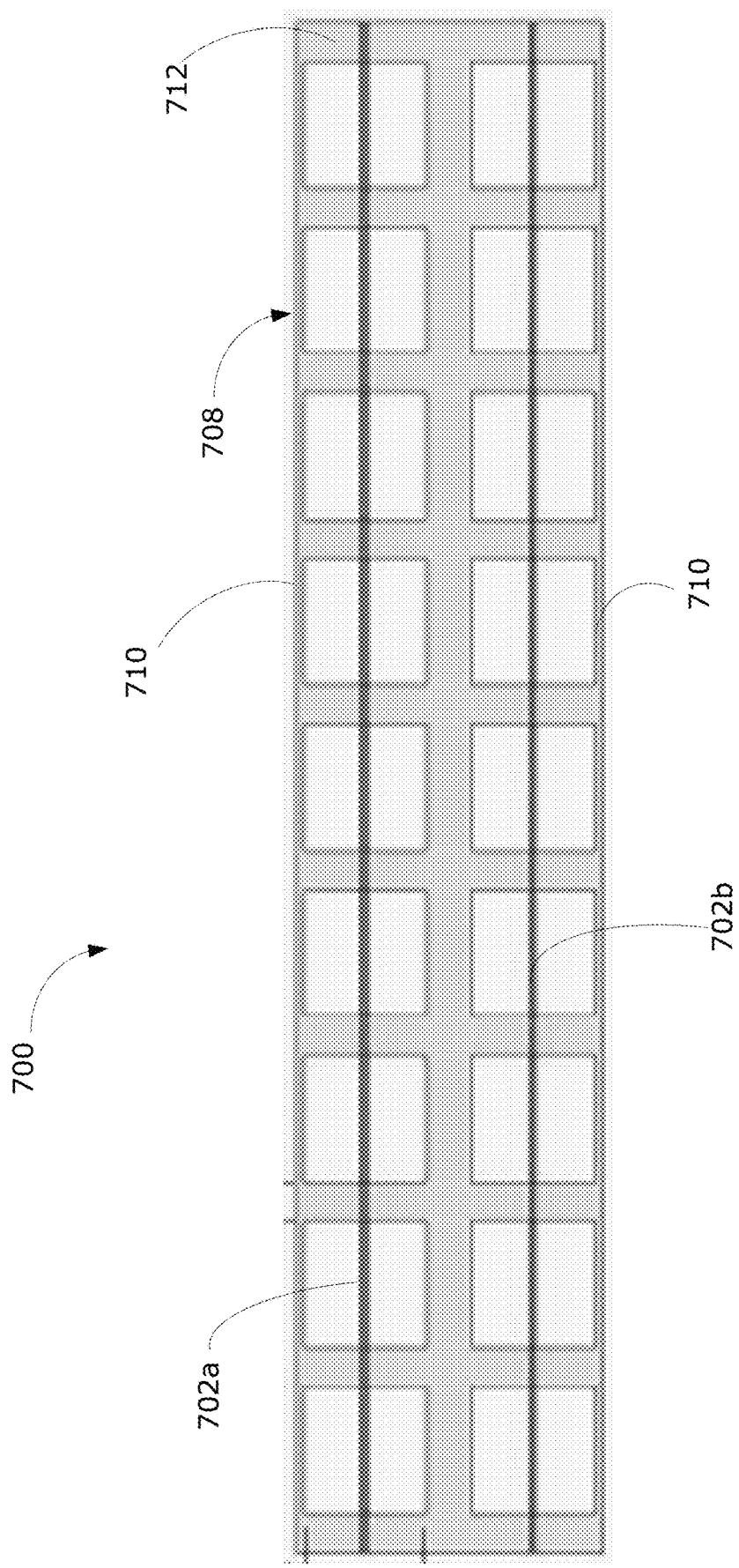

For example, FIGS. 7A and 7B show a perspective view and top view, respectively, of another configuration for the shield cage 708. Compared to the example of FIGS. 6A and 6B, the shield cage 708 has smaller openings which make up a smaller percentage of the overall upper wall 712. This may be suitable where the shield cage 708 needs to compensate for a shield wall 704 having many openings (e.g., to accommodate many lines across the clock lines 702).

Figure 8:
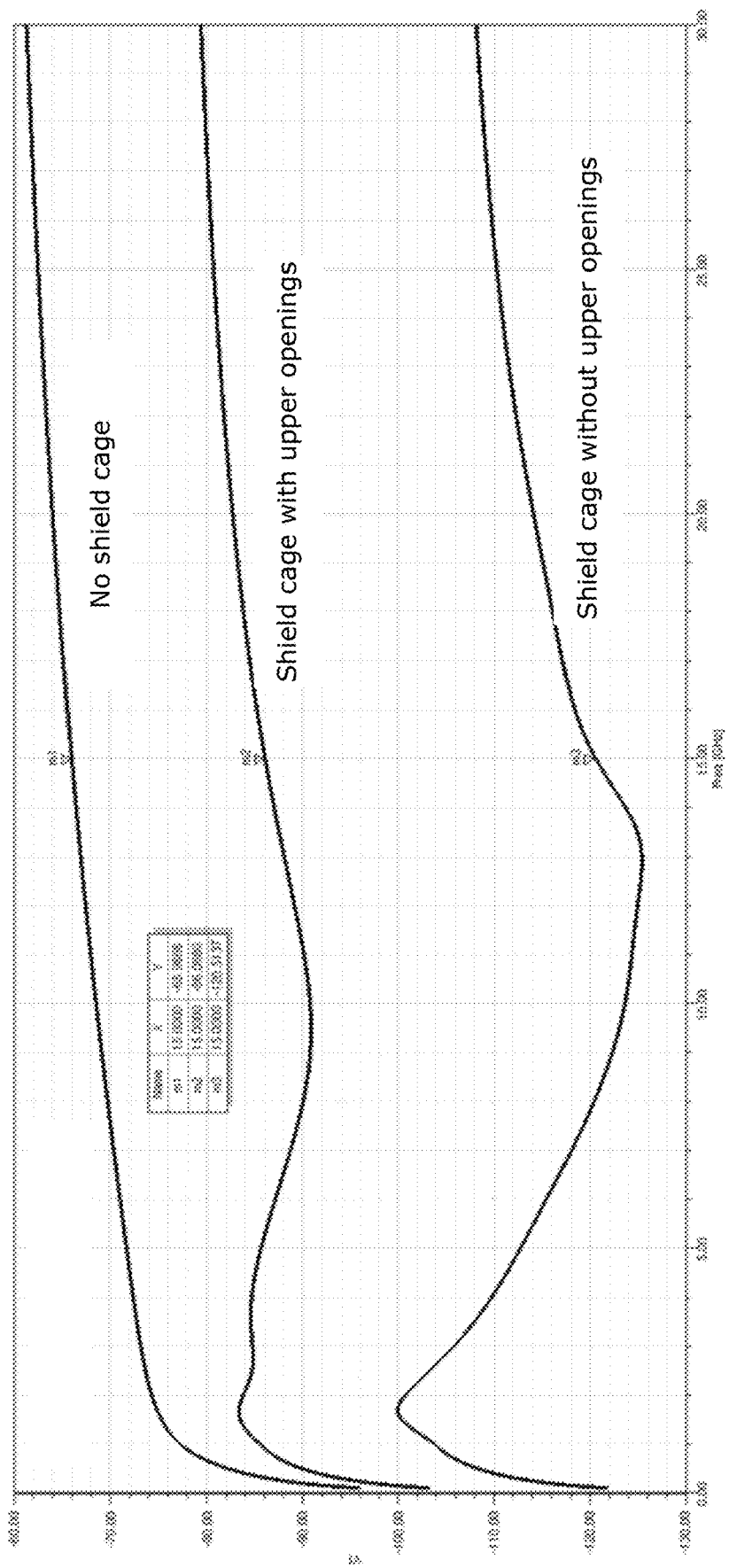
FIG. 8 is a plot of simulation results comparing isolation between clock lines in the example circuits of FIGS. 4, 7A and 11.

FIG. 8 is a plot showing simulation results comparing the isolation of the clock lines in the example circuits of FIGS. 4, 7A and 11, over a range of frequencies.

In simulating the circuit of FIGS. 7A and 7B, the shield cage 708 has side walls 710 spaced 4.52 μm to either side of the clock lines 702 and extending up to the AP layer. The upper wall 712 extends between the side walls 710 across the AP layer. Each opening in the upper wall 712 is a rectangle measuring 10 μm longitudinally (i.e., along the axis of the clock lines 702) and 9.54 μm laterally (both dimensions+/−20%, for example), with a longitudinal spacing of 3 μm between openings. It was found that this configuration achieved an isolation of 100-84 dB over a distance of about 120 um, in the frequency range of interest (10-15 GHz). This may be sufficient to achieve the desired isolation (e.g., meeting a requirement of at least 70 dB isolation at a frequency of 15 GHz).

As shown in FIG. 8, the circuit of FIG. 4 (simulated as having similar dimensions as described above but without a shield cage) is able to achieve an isolation of 66 dB for a 120 μm circuit length in the frequency range 10-15 GHz. In the circuit of FIG. 11, where the shield cage has no upper openings (simulated as having similar dimensions as described above but without openings in the upper wall of the shield cage) has isolation of about 125-120 dB over the frequency range 10-15 GHz. However, as discussed above, in some specific implementations and semiconductor processes, a shield cage without openings in the upper wall may exhibit unacceptably high capacitance, and not be practical to use. A higher capacitance would require a higher power consumption due to the buffers required to drive the clock signal in such high capacitance conditions.

Figure 9:
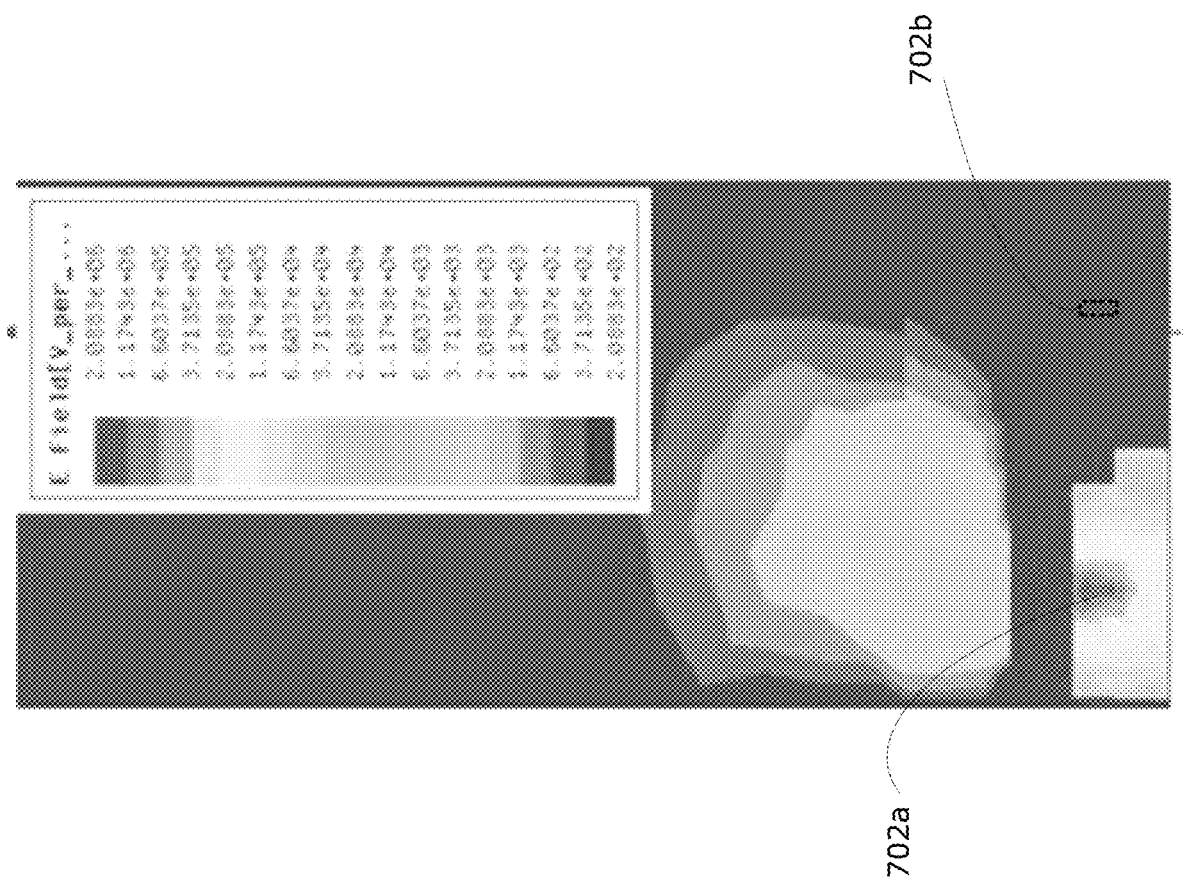
FIG. 9 is a plot showing a simulated electric field produced by one of the clock lines in FIG. 7A.

The simulated electric field emitted by one clock line 702a is plotted in FIG. 9, using the dimensions described above with respect to FIG. 8. As can be seen in FIG. 9, the second clock line 702b (shown by dotted lines) is completely isolated and experiences negligible electric field from the first clock line 702a.

In some examples, there may be one or more portions along the length of the clock lines 602 where the shield structure consists of only the shield wall 604 without the shield cage 608, there may be one or more portions along the length of the clock lines 602 where the shield structure consists of only the shield cage 608 without the shield wall 604 (e.g., to accommodate routing of other signals and/or power lines across the clock lines 602), and there may be one or more portions along the length of the clock lines 602 where the shield structure includes both the shield wall 604 and the shield cage 608. Further, the configuration of the shield cage 608 may be varied along the length of the clock lines 602. For example, in a real integrated circuit implementation, along the distance travelled by the clock distribution circuit, the shield cage 608 may have large openings (e.g., as shown in FIGS. 6A and 6B) in one portion and have smaller openings (e.g., as shown in FIGS. 7A and 7B) in another portion, to accommodate other requirements of the circuit design, for example to route control, data or power signals across the clock lines. The openings in the shield cage 608 may be regularly or irregularly shaped and may be regularly or irregularly spaced. Simulations may be carried out to determine appropriate configurations and dimensions of the openings.

It should be noted that the first layer 206, 406, 606, 706 in the examples described above may also include openings. For example, the first layer 706 below the shield cage 708 may have openings substantially the same as in the upper wall 712, but the openings in the first layer 706 may be offset from the openings in the upper wall 712 (so that there is no direct line-of-sight through both the upper wall 712 and the first layer 706), for better isolation. Although the present disclosure describes example shield cages having side walls and an upper wall, in some cases the first layer may conceptually be considered a bottom wall of the shield cage.

It should be noted that the shield structure along the length of the clock lines may include any combination of shield wall and/or shield cage configurations. For example, a combination of the configurations shown in FIGS. 4, 6 and/or 7A may be provided along the length of a pair of clock lines, to provide the desired isolation. For example, a clock distribution circuit may have a portion along the length of the clock lines in which the shield structure has only the shield wall or only the shield cage, and another portion along the length in which the shield structure has both the shield wall and the shield cage. In another example, a clock distribution circuit may have a first portion along the length of the clock lines in which the shield structure has only the shield wall, a second portion along the length where the shield structure has only the shield cage, and a third portion along the length where the shield structure has both the shield wall and the shield cage. Where possible, it may be desirable for the shield structure to include the shield wall as well as the shield cage (including side walls and upper wall) for as much of the clock distribution circuit as possible, to reduce crosstalk between clock lines. However, in real implementation, the shield structure may be varied along the clock distribution circuit to accommodate for circuit design requirements, such as to accommodate the presence and routing of other lines on the integrated circuit.

It should also be noted that the dimensions and configurations of the shield wall and/or shield cage may vary along the length of the clock lines. For example, the shield cage may have larger openings in a first portion along the length of the clock lines and smaller openings in another portion (e.g., when there are more openings in the shield wall).

Figure 10:
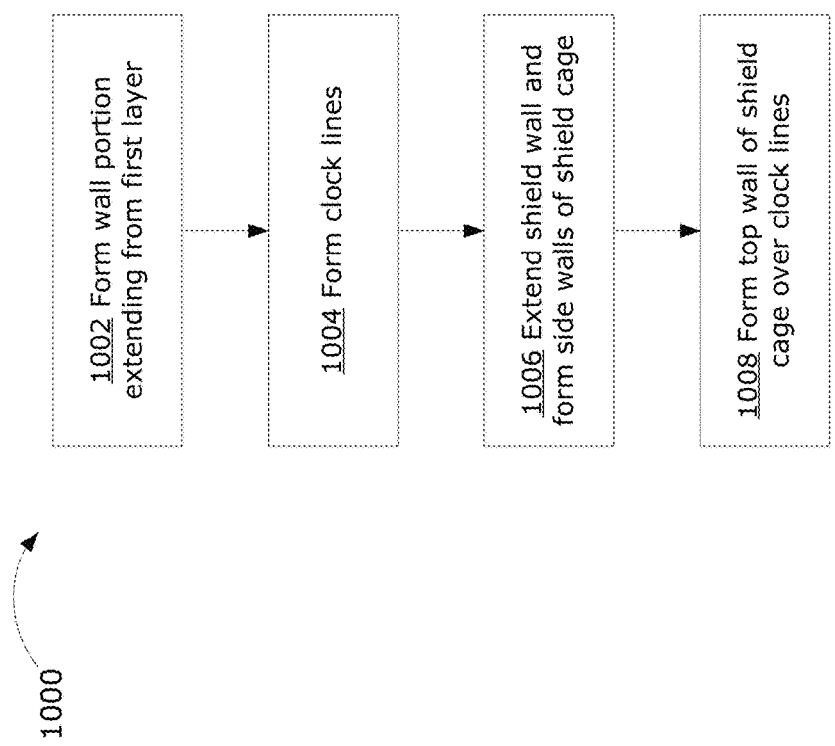
FIG. 10 is a flowchart illustrating an example method for fabricating the example circuits disclosed herein.

FIG. 10 is a flowchart illustrating an example method 1000 for fabricating a clock distribution circuit including shield cage, for example the example circuits 600, 700 shown in FIGS. 6A to 7B. Generally, the circuits disclosed herein may be manufactured using any suitable chip manufacturing process, for example according to the Taiwan Semiconductor Manufacture Company (TSMC) N16FF+ process, or any other process applicable for chips including for 7 nm, 16 nm, 28 nm and 65 nm technologies.

The following example method 1000 is described as an example only and is not intended to be limiting or exhaustive.

At 1002, a portion of the shield wall is formed, extending from the first layer. The wall portion may be formed by deposition onto the first layer, or by etching away portions of the first layer.

At 1004, clock lines for different clock signals are formed, on either side of the wall portion. Any suitable deposition method may be used to form the clock lines.

At 1006, the wall portion may be extended to complete the shield wall. The side walls of the shield cage are also formed, extending from the first layer. This may be carried out as high layers of the integrated circuit is fabricated, for example using selective deposition or etching of subsequent metal layers.

At 1008, the shield cage is formed over the clock lines, extending between the side walls. This may be carried out during fabrication of the topmost metal layer (e.g., AP layer). The shield cage may be formed with appropriate openings in the upper wall of the shield cage, as described above, for example using suitable deposition or etching processes.

In some examples, a connection may be made to connect the first layer to a power supply, for example the ground of a power supply. This may result in the first layer serving as a ground layer (e.g., an AC ground layer).

In examples disclosed herein, a single-ended clock distribution circuit is described that may enable the clock distribution span to be increased, compared with conventional approaches, for specified jitter limits. Example shielding configurations are described, which may help to reduce crosstalk between clocks and therefore reduce the associated clocking jitter. In simulations, examples disclosed herein have been found to enable doubling of the clock distribution span and remain within specified jitter limits for high frequency applications.

Examples disclosed herein may enable control of crosstalk as a tradeoff with line capacitance (which is viewed as a load by the line driver). Generally, the larger the openings in the shield cage, the lower the capacitance but the higher the crosstalk. Accordingly, the driver load and the power consumption of the drivers may also be controlled as a tradeoff with crosstalk.

Examples disclosed herein may be suitable for use in high speed ADCs, long reach serializer/deserializers and/or short reach serializer/deserializers.

The examples disclosed herein provide single-ended clock distribution, which may decrease the distribution power and area required, compared to differential clock distribution circuits.

It should be noted that the shielding described herein, in the context of single-ended clock signals, may also be suitable for shielding of differential clock signals. For example, the shield wall may run between two pairs of differential clock lines and/or the shield cage may surround two pairs of differential clock lines.

Although the present disclosure describes circuits with two clock lines running side-by-side, the example circuits may be adapted for more clock lines running side-by-side. For example, there may be more than two single-ended clock lines running alongside each other, with shield walls between adjacent clock lines and/or a shield cage over the clock lines. In another example, there may be two or more pairs of different clock lines running alongside each other, with shield walls between adjacent pairs and/or a shield cage over the clock lines.

It should also be noted that examples described herein may also be adapted for clock distribution circuits having a single clock line (e.g., a single single-ended clock line or a single pair clock lines for a differential clock signal). For example, a shield cage (e.g., as described in the examples above) may be provided to surround a single clock line. This may serve to shield the single clock line from external interference (e.g., from other signals on the chip). Thus, the present disclosure may be useful to provide shielding even where crosstalk between parallel clock lines is not a concern.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An integrated circuit comprising:
   a first layer;
   a first clock line for carrying a first clock signal;
   a second clock line for carrying a second clock signal, the second clock line running alongside the first clock line for a distance; and
   a shield structure comprising:
      a shield wall extending from the first layer, the shield wall running between the first and second clock lines for at least a first portion of the distance, the shield wall being separate from any signal line; and
   a shield cage extending from the first layer and surrounding the first and second clock lines for at least: the first portion of the distance or a second portion of the distance, the shield cage comprising:
   a first side wall and a second side wall extending from the first layer, each of the first and second side walls being a continuous structure, each of the first and second side walls being positioned alongside a respective one of the first and second clock lines, and an upper wall extending between the first and second side walls and over both the first and second clock lines;

a plurality of openings being defined in each of the first and second side walls, the openings defined in the first side wall being staggered with respect to the openings defined in the second side wall to avoid any direct line-of-sight through both first and second side walls, the openings in the first side wall permitting direct line-of-sight from the first clock line out of the shield cage, and the openings in the second side wall permitting direct line-of-sight from the second clock line out of the shield cage.

2. The integrated circuit of claim 1, wherein a second plurality of openings is further defined in the upper wall.

3. The integrated circuit of claim 1, wherein each opening of the plurality of openings being defined in the first and second side walls has dimensions of about 2.35 µm×3.39 µm.

4. The integrated circuit of claim 2, wherein each opening of the second plurality of openings defined in the upper wall has dimensions of about 9.54 µm×10 µm.

5. The integrated circuit of claim 2, wherein each opening of the second plurality of openings defined in the upper wall has dimensions of about 9.54 µm×42 µm.

6. The integrated circuit of claim 1, wherein the shield wall has at least one opening defined therein.

7. The integrated circuit of claim 1, wherein:
the shield cage extends from the first layer and surrounds the first and second clock lines for the second portion of the distance, wherein the second portion of the distance overlaps all of the first portion of the distance, and the second portion of the distance extends beyond the first portion of the distance.

8. The integrated circuit of claim 1, wherein:
the shield cage extends from the first layer and surrounds the first and second clock lines for the second portion of the distance, wherein the first portion of the distance overlaps all of the second portion of the distance, and the first portion of the distance extends beyond the second portion of the distance.

9. The integrated circuit of claim 1, wherein the shield wall extends from the first layer to a topmost metal layer of the integrated circuit.

10. The integrated circuit of claim 8, wherein the shield cage extends across the topmost metal layer, over the first and second clock lines.

11. The integrated circuit of claim 2, wherein the first layer has defined therein a third plurality of openings, the second plurality of openings defined in the upper wall being staggered with respect to the third plurality of openings defined in the first layer, to avoid any direct line-of-sight through both the upper wall and the first layer.

12. The integrated circuit of claim 1, further comprising a third clock line carrying a third clock signal and a fourth clock line carrying a fourth clock signal, the third and fourth clock lines running alongside the first and second clock lines for at least the distance, wherein the shield structure comprises a plurality of shield walls, each shield wall running between respective adjacent pairs of clock lines for at least a respective first portion of the distance, and wherein the shield cages surrounds the first, second, third and fourth clock lines for at least: the respective first portion of the distance or a respective second portion of the distance.

13. The integrated circuit of claim 1 wherein the first layer is connected to a power supply.

14. The integrated circuit of claim 1 wherein the first layer is connected to a ground of a power supply.

15. The integrated circuit of claim 1 wherein the first layer is an AC ground layer.

16. The integrated circuit of claim 1, wherein:
the shield cage extends from the first layer and surrounds the first and second clock lines for the second portion of the distance, wherein the first portion of the distance overlaps partially with the second portion of the distance, the first portion of the distance extending beyond the second portion of the distance and the second portion of the distance extending beyond the first portion of the distance.

17. An integrated circuit comprising:
a first layer;
a clock line for carrying a clock signal over a distance; and
a shield cage extending from the first layer and surrounding the clock line for at least a portion of the distance, the shield cage comprising:
a first side wall and a second side wall extending from the first layer, each of the first and second side walls being a continuous structure, and an upper wall extending between the first and second side walls and over the clock line;
a plurality of openings being defined in each of the first and second side walls, the openings defined in the first side wall being staggered with respect to the openings defined in the second side wall to avoid any direct line-of-sight through both first and second side walls, the openings in the first side wall permitting direct line-of-sight from the clock line out of the shield cage, and the openings in the second side wall permitting direct line-of-sight from the clock line out of the shield cage.

* * * * *